(12) United States Patent
Yamada

(10) Patent No.: US 6,251,541 B1
(45) Date of Patent: *Jun. 26, 2001

(54) PARTIAL COLLECTIVE MASK FOR A CHARGED PARTICLE BEAM

(75) Inventor: Yasuhisa Yamada, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,604

(22) Filed: Apr. 27, 1998

(30) Foreign Application Priority Data

Apr. 25, 1997 (JP) .................................................. 9-123041

(51) Int. Cl.$^7$ ...................................................... G03F 9/00
(52) U.S. Cl. ................................................ 430/5; 430/296
(58) Field of Search ..................................... 430/5, 22, 30, 430/296, 394

(56) References Cited

U.S. PATENT DOCUMENTS 5,849,437 * 12/1998 Yamazaki et al. ........................ 430/5
5,885,747 * 3/1999 Yamasaki et al. .................... 430/296

FOREIGN PATENT DOCUMENTS 58-200238 * 11/1983 (JP) .
8-45808    2/1996 (JP) .

* cited by examiner

Primary Examiner—Mark F. Huff
Assistant Examiner—Salcha R. Mohamedulla
(74) Attorney, Agent, or Firm—Foley & Lardner

(57) ABSTRACT

A partial collective mask for charged particle beam exposure of the present invention is capable of being easily reshaped in order to obviate snapping, defective contact draw and other critical faults. The mask is formed not only with openings constituting main patterns or device patterns, but also with openings constituting auxiliary patterns. When any one of the main patterns has a size short of a designed size and is apt to bring about snapping or similar critical fault, such a defective pattern and the auxiliary patterns adjoining it are jointed together so as to correct the size.

7 Claims, 4 Drawing Sheets

PARTIAL COLLECTIVE MASK FOR A CHARGED PARTICLE BEAM

BACKGROUND OF THE INVENTION

The present invention relates to a partial collective mask for charged particle beam exposure implementing the collective transfer of a plurality of desired patterns.

A high throughput is the prerequisite with the production of modern semiconductor devices. This is also true with lithography for forming fine patterns in a semiconductor wafer. To realize a high throughput, there has been proposed a transfer procedure using a charged particle beam mask equivalent to a mask or a reticle formed with a desired pattern beforehand and adapted for light or X rays. A partial collective mask for this kind of transfer procedure and adapted for a charged particle beam is usually formed with openings for variable shaping and openings representative of contact patterns, line-and-space patterns or similar repetitive patterns derived from device design data.

To produce the partial collective mask, a silicon (Si) wafer as thick as 20 $\mu$m has customarily been subjected to trench etching so as to form device patterns or openings. However, the problem is that the patterns to be formed in the mask each need a particular etching time in accordance with the area of its opening. It is a common practice to enhance the shaping accuracy by optimizing the composition and flow rate of a gas, etching time and so forth. The opening areas of device patterns sometimes differ from each other by 70% or more. This, coupled with the fact that differences between etching conditions in the wafer plane are not negligible, brings about a scatter in the size of the pattern or opening. Therefore, when the pattern or opening has a size smaller than a designed size, there occur various faults including the defective draw of contacts and defective partial-collective connection; in the worst case, snapping and other critical faults occur. The mask cannot be corrected in shape even in the event of such a critical fault.

SUMMARY OF THE INVENTION

It is therefore an object of the present invention to provide a partial collective mask for charged particle beam exposure and capable of obviating inaccurate writing ascribable to inaccurate openings.

In accordance with the present invention, in a partial collective mask for shaping a charged particle beam implemented as an electron beam output from an electron gun or an ion beam output from an ion source, auxiliary patterns in the form of openings are formed in addition to desired main patterns in the form of openings.

Also, in accordance with the present invention, in an exposing method using a charged particle beam, patterns are written by using a partial collective mask for shaping a charged particle beam implemented as an electron beam output from an electron gun or an ion beam output from an ion source. The partial collective mask includes desired main patterns and auxiliary patterns.

Further, in accordance with the present invention, a partial collective mask for charged particle beam exposure for transferring a plurality of desired patterns collectively includes a desired main pattern in the form of openings, and auxiliary patterns in the form of openings for reshaping. When any one of the main patterns has a size smaller than a designed size, the auxiliary patterns adjoining the main pattern are reshaped and joined with the main pattern. As a result, snapping or similar connection fault ascribable to the size smaller than the designed size is obviated.

Moreover, in accordance with the present invention, a partial collective mask for use in an electron beam writing device for electron beam exposure which transfers a plurality of desired patterns collectively includes desired main patterns in the form of openings, and auxiliary patterns in the form of openings each having a size not resolving when subjected to an electron beam. The auxiliary patterns are positioned such that a portion bridging the end or the corner of any one of the main patterns and one of the auxiliary patterns adjoining it is removable.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figures 1A, 1B, 1C:
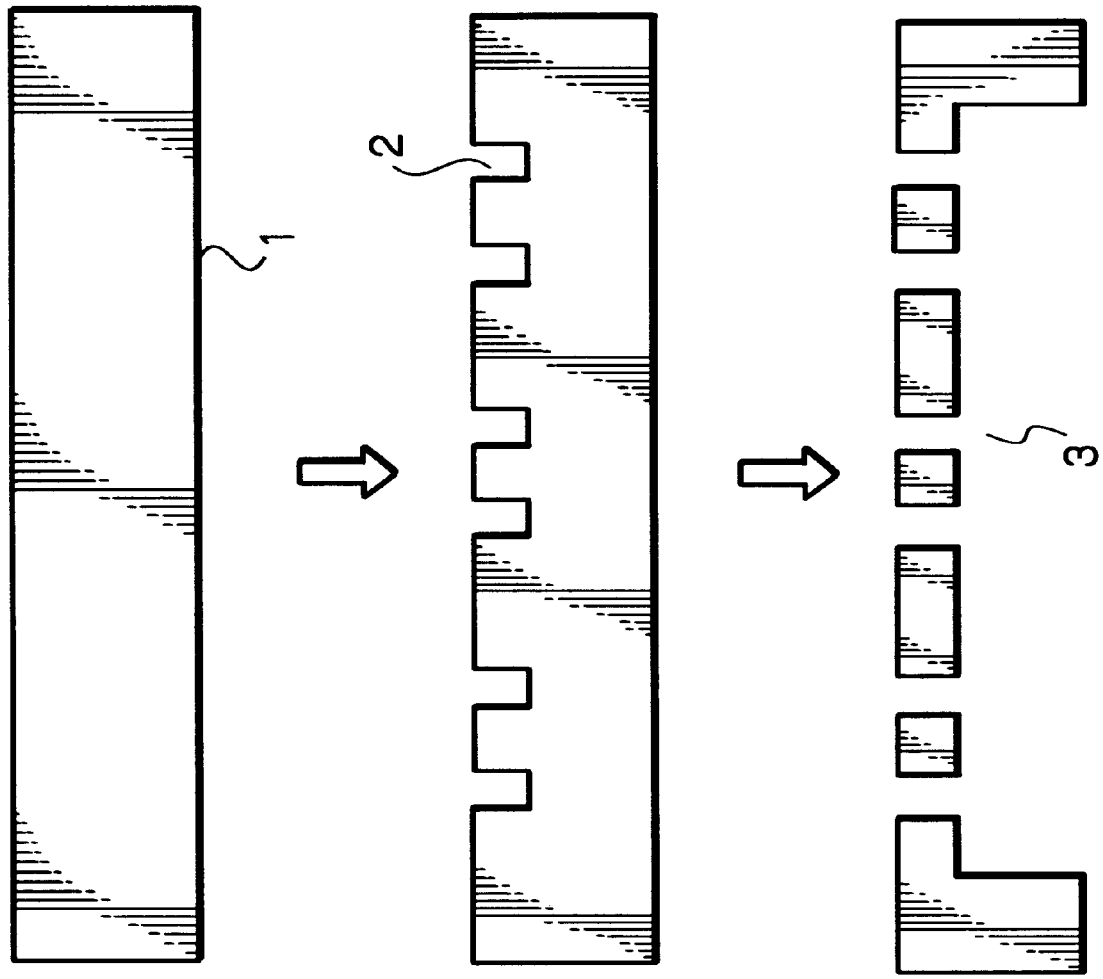
FIGS. 1A–1C show a conventional procedure for producing a partial collective mask and a problem with the conventional procedure.

To better understand the present invention, brief reference will be made to a conventional procedure for producing a partial collective mask for a charged particle beam, shown in FIGS. 1A–1C. First, as shown in FIG. 1A, an Si wafer 1 as thick as 20 $\mu$m is subjected to trench etching. FIG. 1B shows the resulting device patterns 2 formed in the wafer 1. Subsequently, as shown in FIG. 1C, the wafer 1 is subjected to back etching by, e.g., KOH and formed with holes 3. Usually, after a plurality of such masks have been formed in an Si wafer, the wafer is diced.

However, the patterns to be formed in the mask each needs a particular etching time in accordance with the area of its opening, as stated earlier. The opening areas of device patterns sometimes differ from each other by 70% or more, resulting in a scatter in the size of the pattern or opening. Consequently, there occur various faults including the defective draw of contacts and defective partial-collective connection; in the worst case, snapping and other critical faults occur.

Preferred embodiments of the partial collective mask in accordance with the present invention will be described hereinafter. Briefly, in accordance with the present invention, auxiliary patterns or openings are formed in a mask in order to allow inaccurate main patterns or openings to be reshaped or repaired. The auxiliary patterns should preferably be sized 0.2 $\mu$m or below so as not to resolve when subjected to direct EB (Electron Beam) writing, although the size depends on the limit resolution of a device. When any one of the main patterns has a size smaller than a designed size and apt to bring about snapping or similar critical fault, the defective main pattern and the auxiliary patterns adjoining it are joined together by, e.g., FIB (Focused Ion Beam) or a laser beam in order to correct the size. An FIB repairing device is available which repairs a mask by accelerating and focusing ions heavier than electrons With the auxiliary patterns, it is possible to reshape the main patterns, or device patterns, of a mask relatively easily. This successfully reduces snapping, defective contact draw and other faults apt to occur at portions connected by a partial collective shot.

Figure 2A:
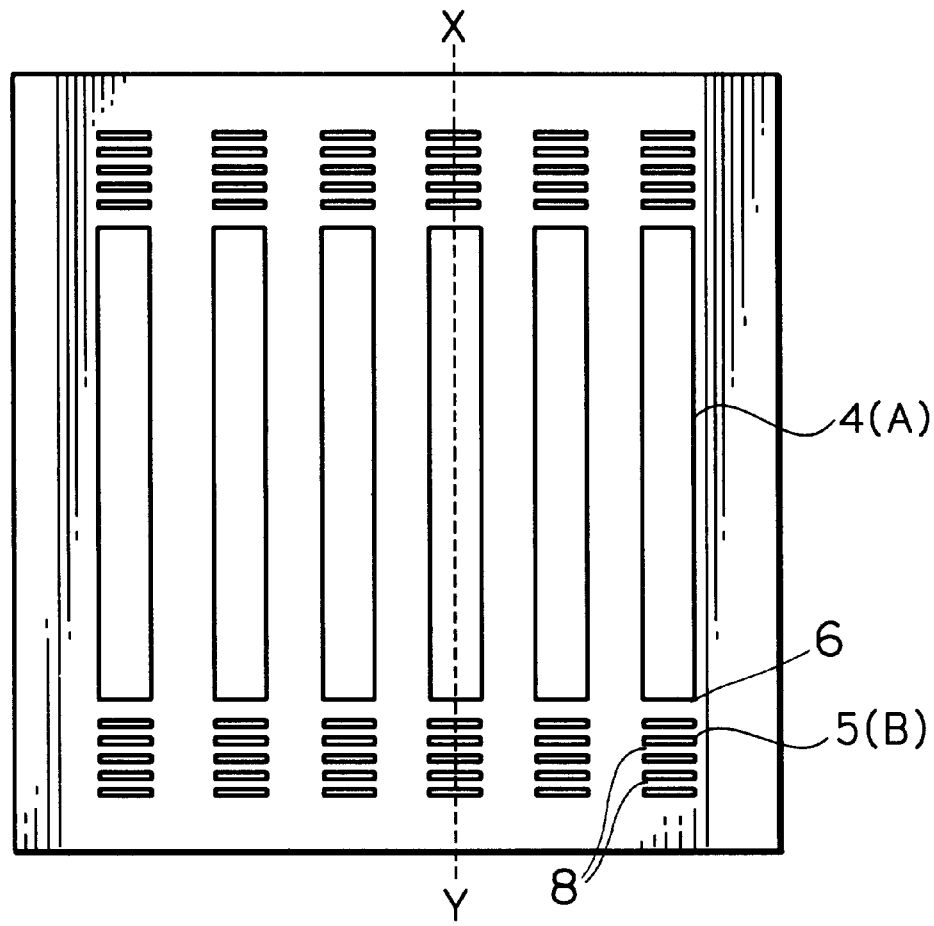
FIGS. 2A and 3A are plan views showing a partial collective mask embodying the present invention.
Figure 2B:
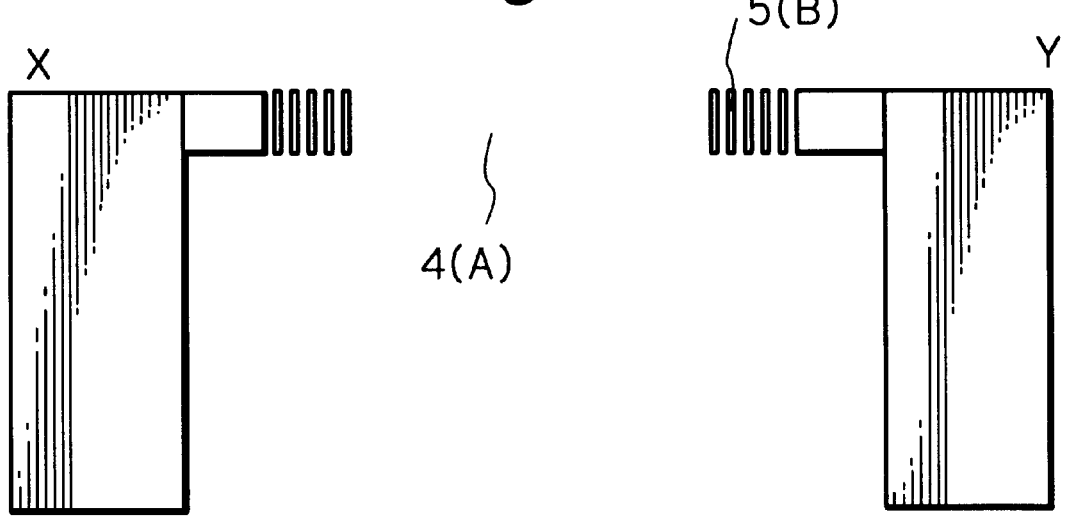
FIGS. 2B and 3B are respectively sections along lines X–Y of FIGS. 2A and 3A.
Figure 3A:
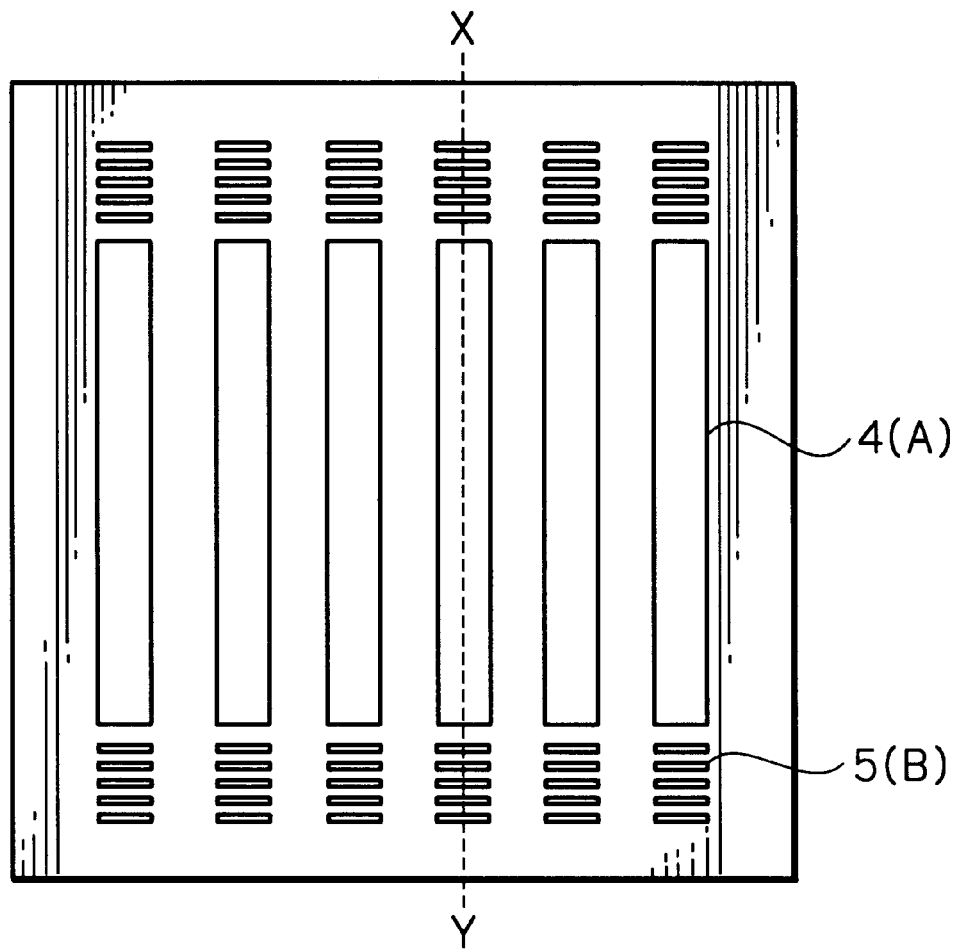
Figure 3B:
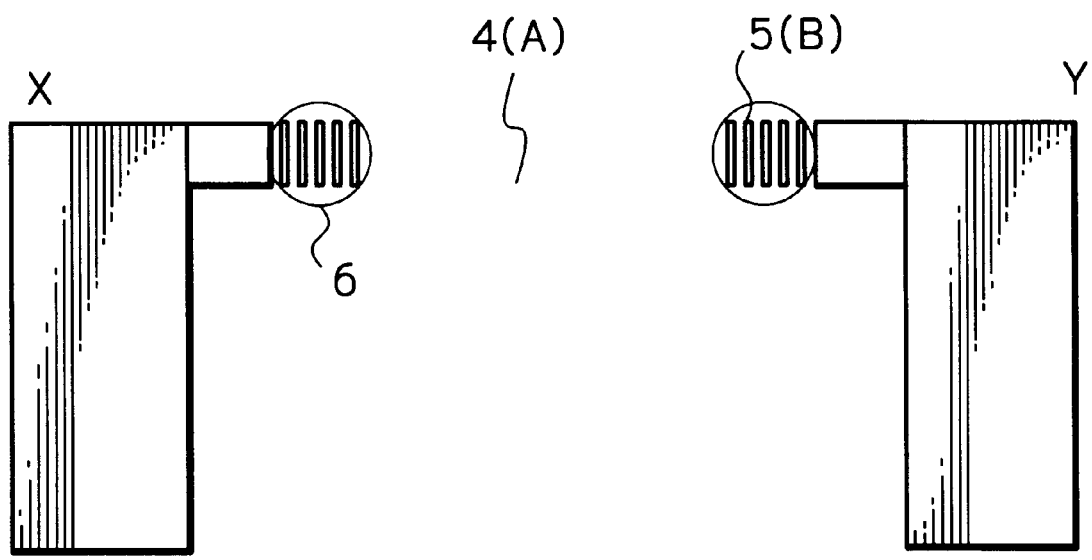

Referring to FIGS. 2A, 2B, 3A and 3B, a partial collective mask embodying the present invention will be described. As shown in FIGS. 2A and 2B, a mask includes main patterns or device pattern 4 and auxiliary patterns 5 which may be used to reshape the main patterns 4. The device patterns 4 and 5 are respectively implemented as openings A and B; the openings B respectively adjoin opposite ends of the openings A, as illustrated. Openings A of the auxiliary pattern are separated from the opening B of the main pattern by a region 6 and are separated from one another by regions 8 as shown in FIG. 2A. The auxiliary patterns 5 each is sized about 0.1 μm and will not resolve when subjected to conventional direct EB writing. Assume that any one of the openings A formed in the mask has a size smaller than a designed size and apt to bring about snapping or similar critical fault. Then, as shown in FIG. 3B, the portions 6 of the mask where the openings (auxiliary patterns) B adjoin such a defective opening A (main pattern) are suitably removed to join the openings A and B to each other. This successfully obviates the above critical fault.

Figure 4A:
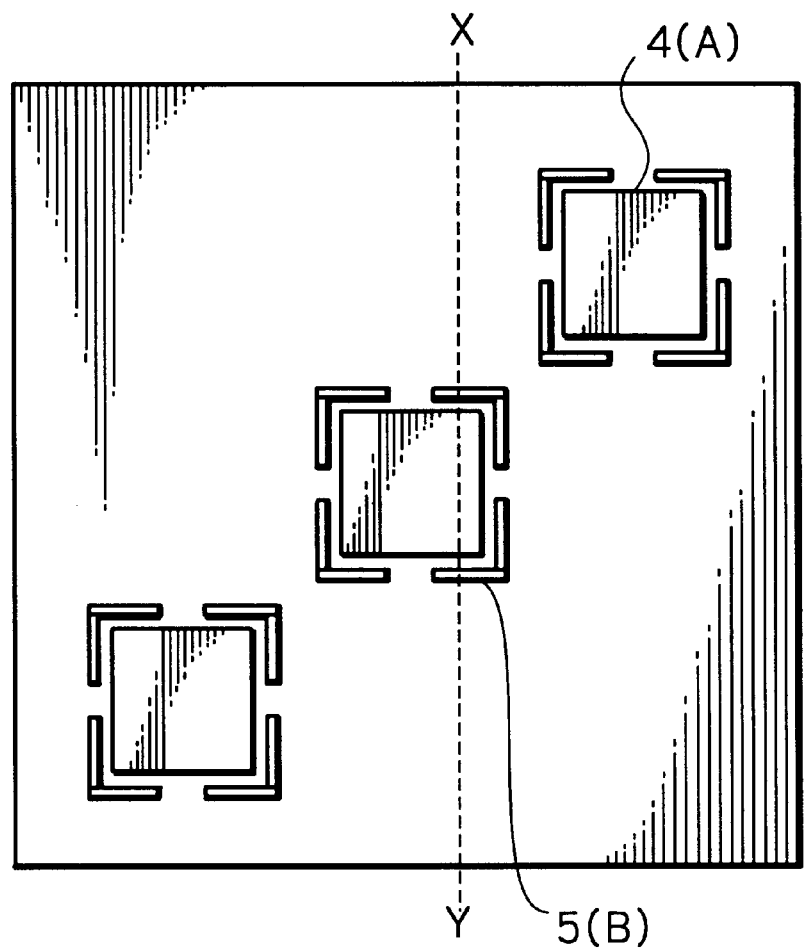
FIG. 4A is a plan view showing an alternative embodiment of the present invention.
Figure 4B:
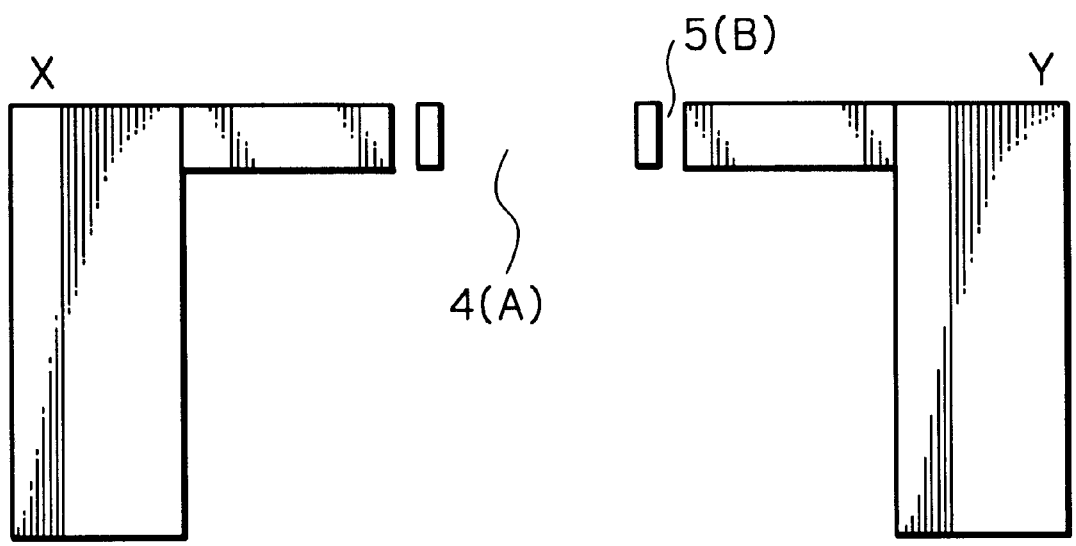
FIG. 4B is a section along line X–Y of FIG. 4A.

FIGS. 4A and 4B show an alternative embodiment of the present invention. As shown, a mask includes main patterns or device patterns 4 implemented as openings A and auxiliary patterns 5 implemented as openings B. In the illustrative embodiment, four openings B are respectively positioned in the vicinity of the four corner portions of each opening A. The auxiliary patterns 5 each is sized about 0.1 μm and will not resolve when subjected to conventional direct EB writing. When any one of the openings A formed in the mask has a size smaller than a designed size and apt to bring about undesirable results, such a defective opening A and the openings B adjoining it will be joined together, as in the previous embodiment. This successfully obviates defective contact draw.

In summary, it will be seen that the present invention provides a partial collective mask capable of being easily reshaped in order to obviate snapping, defective contact draw and other critical faults. Specifically, the mask is formed not only with openings constituting main patterns or device patterns, but also with openings constituting auxiliary patterns. When any one of the main patterns does not have an expected size and is apt to bring about snapping or similar critical fault, such a defective pattern and the auxiliary patterns adjoining it are jointed together so as to correct the size.

Various modifications will become possible for those skilled in the art after receiving the teachings of the present disclosure without departing from the scope thereof.

What is claimed is:

1. A partial collective mask for shaping a charged particle beam implemented as an electron beam output from an electron gun or an ion beam output from an ion source comprising:

main patterns in a form of openings, and auxiliary patterns in a form of openings in addition to said main patterns, openings in said auxiliary patterns each having a size which is not resolved when subjected to the charged particle beam, said auxiliary patterns separated from said main patterns by a region which is removable for joining together at least one opening of said main patterns with at least one opening of said auxiliary patterns.

2. A mask as claimed in claim 1, wherein said auxiliary patterns respectively adjoin opposite ends of a respective one of said main patterns.

3. A mask as claimed in claim 1, wherein said auxiliary patterns are positioned such that a portion bridging an end or a corner of any one of said main patterns and one of said auxiliary patterns adjoining said end or said corner is removable by a focused ion Bean (FIB) or a laser.

4. A partial collective mask for charged particle beam exposure for transferring a plurality of desired patterns collectively, said partial collective mask comprising:

desired main patterns in a form of openings; and auxiliary patterns in a form of openings for reshaping, opening in said auxiliary patterns each having a size which is not resolved when subjected to said charged particle beam exposure, said auxiliary patterns separated from said main patterns by a region which is removable for joining together at least one opening of said main patterns with at least one opening of said auxiliary patterns wherein when any one of said main patterns has a size smaller than a designed size, said auxiliary patterns adjoining the one main pattern are reshaped and joined with said one main pattern, whereby snapping or similar connection fault ascribable to the size smaller than the designed size is obviated.

5. A partial collective mask for use in an electron beam writing device for electron beam exposure which transfers a plurality of desired patterns collectively, said partial collective mask comprising:

desired main patterns in a form of openings; and auxiliary patterns in a form of openings each having a size not resolving when subjected to an electron beam;

said auxiliary patterns being positioned such that a portion bridging an end or a corner of any one of said main patterns and one of said auxiliary patterns adjoining said end or said corner is removable.

6. A method of forming a mask for use in charge particle beam exposure comprising the steps of providing said mask with a main pattern having at least one opening, providing said mask with an auxiliary pattern, said auxiliary pattern having at least one opening that is not resolved when is subjected to said charged particle beam exposure, said at least one opening of said main pattern separated from said at least one opening of said auxiliary pattern by a removable region.

7. The method as claimed in claim 6, further comprising the step of connecting said at least one opening of said auxiliary pattern with said at least one opening of said main pattern by removing said removable region to form a continuous, combined opening.

* * * * *